United States Patent
Biloiu (10) Patent No.: US 9,299,536 B2
(45) Date of Patent: Mar. 29, 2016

(54) WIDE METAL-FREE PLASMA FLOOD GUN

(71) Applicant: Varian Semiconductor Equipment Associates, Inc., Gloucester, MA (US)

(72) Inventor: Costel Biloiu, Rockport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 258 days.

(21) Appl. No.: 14/056,149

(22) Filed: Oct. 17, 2013

(65) Prior Publication Data

US 2015/0108894 A1    Apr. 23, 2015

(51) Int. Cl.
*H01Q 1/26*        (2006.01)
*H01J 37/32*       (2006.01)

(52) U.S. Cl.
CPC ....... *H01J 37/3211* (2013.01); *H01J 37/32412* (2013.01)

(58) Field of Classification Search
CPC .................................................. H01J 37/32669
See application file for complete search history.

(56) References Cited

U.S. PATENT DOCUMENTS

| | | | | | |
|---|---|---|---|---|---|
| 5,206,516 | A * | 4/1993 | Keller | ..................... | H01J 37/05 250/396 R |
| 5,429,070 | A * | 7/1995 | Campbell | ............. | C23C 16/513 118/79 |
| 5,444,207 | A * | 8/1995 | Sekine | ................. | B23K 10/003 156/345.46 |
| 5,686,796 | A * | 11/1997 | Boswell | ................... | H05H 1/46 118/723 I |
| 5,767,628 | A * | 6/1998 | Keller | ................. | H01J 37/3211 118/723 AN |
| 6,028,285 | A * | 2/2000 | Khater | ................. | H01J 37/321 118/723 I |
| 6,051,073 | A * | 4/2000 | Chu | ..................... | H01J 37/321 118/723 E |
| 6,087,778 | A * | 7/2000 | Benjamin | ............. | H01J 37/321 118/723 AN |
| 6,273,022 | B1 * | 8/2001 | Pu | ......................... | H01J 37/321 118/723 I |
| 6,541,781 | B1 * | 4/2003 | Benveniste | ............. | H01J 37/05 250/294 |
| 6,568,346 | B2 * | 5/2003 | Pu | ......................... | H01J 37/321 118/723 AN |
| 6,632,324 | B2 * | 10/2003 | Chan | ....................... | H01J 37/20 118/723 I |
| 7,482,597 | B2 * | 1/2009 | Grassauer | ................ | H05H 1/54 250/281 |
| 8,142,607 | B2 | 3/2012 | Biloiu et al. | | |
| 8,471,476 | B2 * | 6/2013 | Kurunczi | .............. | H01J 37/026 250/492.21 |
| 2002/0185226 | A1 | 12/2002 | Lea et al. | | |
| 2006/0197457 | A1 | 9/2006 | Vukovic et al. | | |
| 2009/0095894 | A1 * | 4/2009 | Koo | ....................... | H01J 37/026 250/251 |
| 2010/0055345 | A1 * | 3/2010 | Biloiu | ..................... | H01J 27/18 427/569 |

(Continued)

FOREIGN PATENT DOCUMENTS

WO    2007-002455 A2    1/2007
WO    2013-054960 A1    4/2013

OTHER PUBLICATIONS

Y.S. Hwang, et al., Conceptual design of a heilcon ion souce for high-current dc accelerators, Review of Scientific Instruments, Mar. 1998, pp. 1344-1348, vol. 69, No. 3, AIP Publishing.

(Continued)

*Primary Examiner* — Tung X Le
*Assistant Examiner* — Srinivas Sathiraju (57) ABSTRACT

In one embodiment an apparatus to provide electrons to a substrate includes a plurality of helicon plasma sources arranged in a helicon source array, wherein each helicon plasma source comprises a helical antenna configured to generate a wave vector parallel to a first axis; and a magnet configured to generate a magnetic field vector parallel to the first axis, wherein each helicon plasma source is further configured to generate a respective magnetic field vector that is opposite that of a magnetic field vector of an adjacent helicon plasma source.

17 Claims, 6 Drawing Sheets

(56) References Cited

U.S. PATENT DOCUMENTS

2010/0213851 A1 8/2010 Chang Diaz
2010/0230053 A1* 9/2010 Nishio .............. H01J 37/32091
156/345.49

OTHER PUBLICATIONS

Max Light, et al., Helicon wave excitation with helical antennas, Physics of Plasmas, Apr. 1995, pp. 1084-1093, vol. 2, No. 4, AIP Publishing.

Y. Sakawa, et al. Characteristics of the high density plasma production by m=0 helicon wave, Applied Physics Letters, Sep. 16, 1996, pp. 1695-1697, vol. 69, No. 12, AIP Publishing.

Francis F. Chen, et al., Permanent-Magnet Helicon Discharge Array, IEEE Transactions on Plasma Science, Nov. 2011, pp. 2452-2453. vol. 39, No. 11, IEEE.

R.W. Boswell, Very Efficient Plasma Generation by Whistler Waves Near The Lower Hybrid Frequency, Plasma Physics and Controlled Fusion, 1984, pp. 1147-1162, vol. 26, No. 10, Institute of Physics and Pergamon Press Ltd., Great Britain.

M. Kramer, et al., Helicon sources with m=1 and m=2 helical antenna coupling, Plasma Sources Science and Technology, Aug. 19, 2002, pp. A120-A130, vol. 11, Institute of Physics Publishing.

International Search Report and Written Opinion Mailed Jan. 22, 2015 for PCT/US2014/060677 Filed Oct. 15, 2014.

* cited by examiner

FIG. 5B

WIDE METAL-FREE PLASMA FLOOD GUN

FIELD

The present embodiments relate to an ion implantation apparatus, more particularly, to plasma flood sources for ion implantation.

BACKGROUND

Large format ion implantation applications, such as implantation into silicon substrates or into large area flat panels, may employ extra wide ion beams having width between 0.5 to 6 meters. Ion implantation is often performed using an ion beam of positively charged ions which may be neutralized near a substrate surface using electrons in order to prevent charge buildup on the substrate.

In conventional technology a plasma flood gun may be used to generate electrons for neutralization of the ion beam proximate a substrate surface. The plasma source in conventional plasma flood guns may contain a plasma chamber wherein a plasma is generated through ionization of atoms of an inert gas such as argon (Ar), xenon (Xe) or krypton (Kr). The plasma flood gun is positioned proximate the ion beam so that electrons from the plasma may diffuse into the ion beam and drawn towards the target substrate to neutralize positive charge on the substrate.

One issue that arises with the use of present day plasma flood guns is that of metal contamination. In particular, certain conventional plasma flood guns use a hot tungsten filament for plasma generation in an arc discharge. When the hot tungsten filament reaches a sufficient temperature, electrons may be emitted and accelerated to ionize gaseous species to create the plasma. This type of plasma flood gun may generate sufficient plasma density ($\geq 10^{13}$ cm$^{-3}$) to produce a flux of electrons to neutralize an ion beam proximate a substrate surface. However, during operation, the tungsten filament is gradually consumed by sputtering and evaporation and tungsten atoms may contaminate the ion implantation system. Moreover, these tungsten atoms may be ionized in the plasma and transported through the beam line toward the substrate thus compromising the semiconductor structure functionality.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment, an apparatus to provide electrons to a substrate includes a plurality of helicon plasma sources arranged in a helicon source array. Each helicon plasma source includes a helical antenna configured to generate a wave vector parallel to a first axis; and a magnet configured to generate a magnetic field vector parallel to the first axis. Each helicon plasma source is further configured to generate a respective magnetic field vector that is opposite that of a magnetic field vector of an adjacent helicon plasma source.

In a further embodiment, an ion implantation system includes beam components to direct an ion beam to a substrate; and a plasma flood gun disposed proximate the substrate. The plasma flood gun may include a plurality of helicon plasma sources arranged in a helicon source array, where each helicon plasma source comprises a helical antenna configured to generate a helicon wave having the wave vector parallel to a first axis; and a magnet configured to generate a magnetic field vector parallel to the first axis. Each helicon plasma source is further configured to generate a respective magnetic field vector that is opposite that of a magnetic field vector of an adjacent helicon

DETAILED DESCRIPTION

The present embodiments will now be described more fully hereinafter with reference to the accompanying drawings, in which some embodiments are shown. The subject matter of the present disclosure, however, may be embodied in many different forms and should not be construed as limited to the embodiments set forth herein. Rather, these embodiments are provided so that this disclosure will be thorough and complete, and will fully convey the scope of the subject matter to those skilled in the art. In the drawings, like numbers refer to like elements throughout.

The embodiments described herein provide novel plasma flood gun apparatus. Plasma flood guns often are designed to provide a stream of low energy electrons that have energies of few eV and may be used to cover a target or flood area with a desired flux of electrons. In various embodiments, the novel plasma flood guns are arranged within an ion implantation apparatus to provide improved ion implantation processing that reduces or eliminates substrate charging when exposed to ions.

Consistent with the present embodiments, a plasma flood gun is constructed from a plurality of helicon plasma sources that are arranged in an array. Each helicon plasma source provides a high density plasma from which a high flux of electrons may be obtained. In various embodiments the helicon plasma sources are arranged in a one dimensional (linear) array of 1×N helicon plasma sources in which N may be any non-zero integer. However, in other embodiments, a two dimensional array of N×M helicon plasma sources, where M is any non-zero integer, is provided.

Among benefits conferred by the architecture of plasma flood guns provided by the present embodiments is the ability to provide a uniform flux of electrons over a large width, such as between 0.5 m and 6 m, which electron flux may be applied to neutralize areas exposed to ion beams of similar dimension, and in particular, to neutralize wide positive ion beams. Consistent with the present embodiments, the design width of a plasma flood gun may be increased simply by adding helicon plasma sources to form a longer array and by increasing the width of a diffusion chamber to accommodate the longer array. This allows the plasma flood guns of the present embodiments to scale with increased width of an ion beam to be neutralized. In addition, the helicon plasma sources of the present embodiments provide a high plasma density that generates sufficient electrons to neutralize high ion beam current. A further benefit of the present embodiments as discussed below is that the exemplary plasma flood guns do not generate metal contamination during operation. In addition, the compact size of individual helicon plasma sources in the embodiments disclosed herein facilitates placement of a plasma flood gun proximate a substrate to be treated with electrons.

Figure 1A:
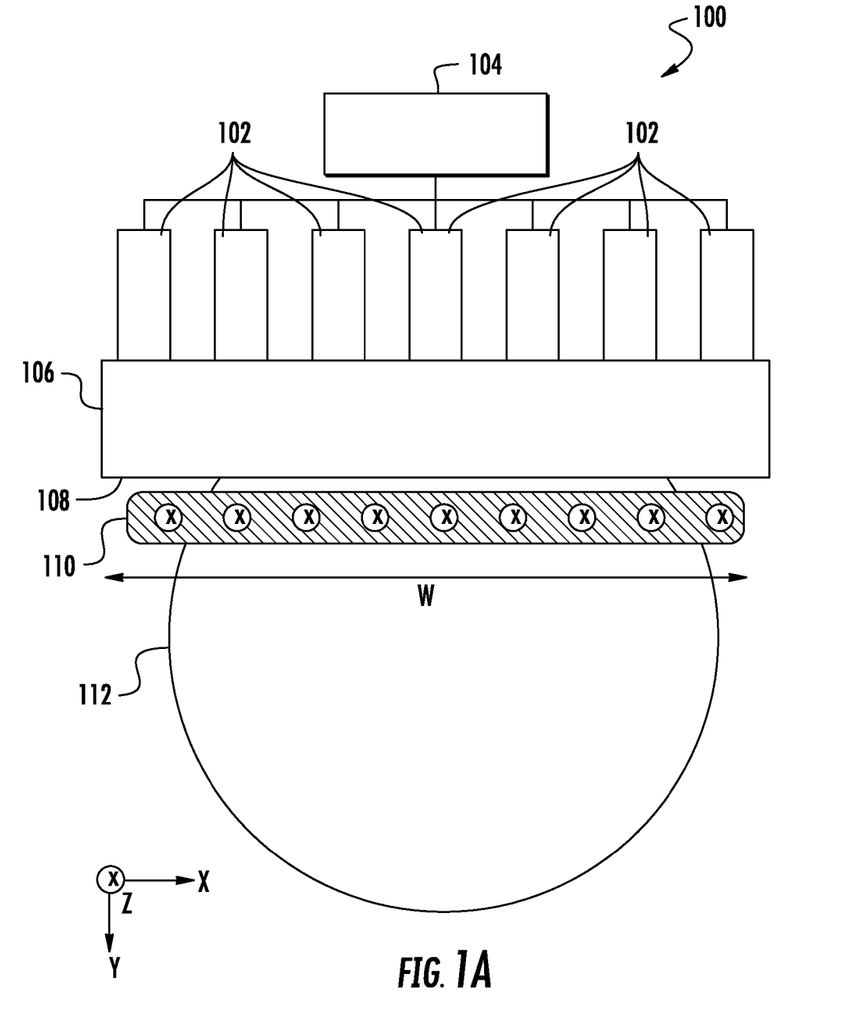
FIG. 1A presents an exemplary plasma flood gun consistent with embodiments of the present disclosure.

FIG. 1A presents a side view in block form of a plasma flood gun 100 according to some embodiments. The plasma flood gun 100 includes multiple helicon plasma sources 102 that are arranged in a one dimensional array along the X-direction in the Cartesian coordinate system shown. The multiple helicon plasma sources 102 are each operative to provide electrons to a diffusion chamber 106 that is disposed adjacent to the array of helicon plasma sources 102. Electrons may exit the diffusion chamber 106 along the side 108, which is provided with one or more apertures (not shown). By proper arrangement of the helicon plasma sources 102, a uniform electron flux may be produced along the X-direction that extends over the width W of the plasma flood gun 100. In some embodiments the size and spacing of helicon plasma sources 102 is such that 2-6 helicon plasma sources 102 are spaced along each meter of width of the plasma flood gun 100. Thus, a 2-meter wide plasma flood gun may employ a linear array of six helicon plasma sources in one example. The helicon plasma sources 102 are capable of achieving a very high ionization efficiency that facilitates the generation of sufficient electron flux to neutralize 2-3 mA/cm positive ion beam current per centimeter of ribbon ion beam width, even while operating the helicon plasma sources 102 at moderate power levels below 1000 W. In operation, to neutralize charge generated by an ion beam, the plasma flood gun 100 may be placed proximate an ion beam 110 that is shown in cross-section and is directed along the Z-direction as shown toward the substrate 112. After exiting the plasma flood gun 100 along the width W, at least some electrons may impinge upon a substrate 112, which is located just downstream of the plasma flood gun 100. Accordingly substrate 112 may be treated by a uniform density of electrons (not shown) across the width W while the substrate 112 is implanted with ions from the ion beam 110.

As illustrated in FIG. 1A, each of the helicon plasma sources 102 is coupled to the RF generator 104 to receive an RF signal. The RF signal is conducted through a helical antenna (not shown in FIG. 1A) discussed in more detail below. The use of a common RF generator, that is, RF generator 104, allows the phenomenon of cross-talk/electromagnetic wave superposition between adjacent helicon sources to be suppressed by careful tailoring of the current-voltage phase shifts in each element of the array. In other embodiments, for example, plasma flood guns that are several meters in length, ten or more helicon plasma sources may be employed. In such cases multiple RF generators that are phase locked may be employed to drive the helicon plasma sources. Accordingly, the embodiments generally represented by FIG. 1A provide a scalable-width plasma flood gun architecture. In particular, the architecture allows a plasma flood gun to be constructed to provide uniform neutralization for high current density wide ion beams of 2-3 mA/cm in some cases, and of any target width. Such architecture may be advantageously employed in systems such as ion implantation systems for large area substrates and high throughput ion implantation systems.

Figure 1B:
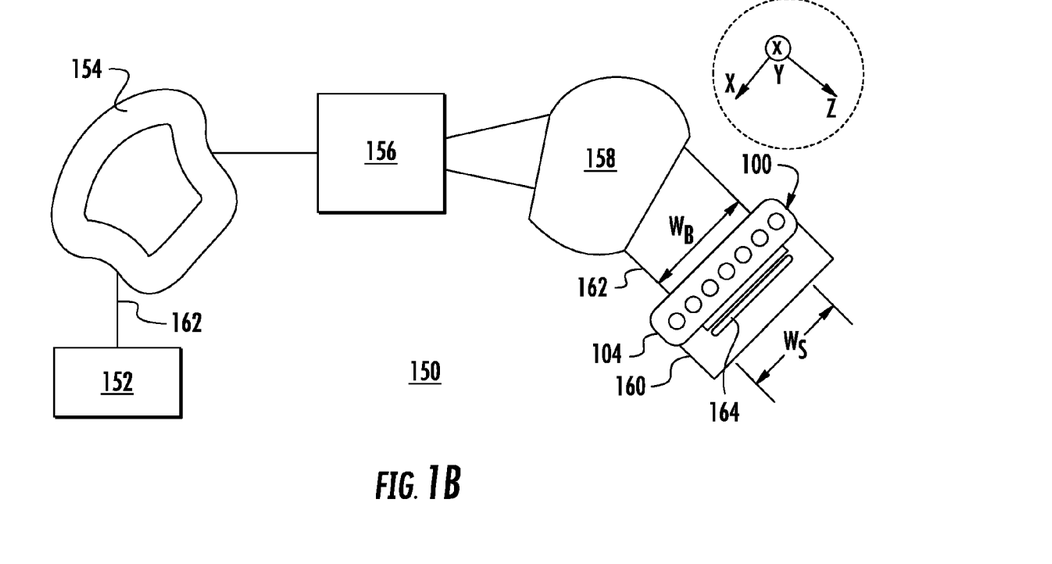
FIG. 1B presents an exemplary ion implantation system consistent with various embodiments.

FIG. 1B depicts a top view of an exemplary ion implantation system 150 that may employ a plasma flood gun of the present embodiments. The various components of the ion implantation system 150 that are used to direct an ion beam to a substrate include an ion source 152, analyzing magnet 154, electrostatic scanner 156, magnetic collimator 158, and substrate stage 160. The ion implantation system 150 is configured to generate an ion beam 162 and deliver the ion beam 162 to a substrate 164 while providing electrons to the substrate to neutralize any charge buildup. The particular configuration illustrated in FIG. 1A may be particularly suited for medium current ion implantation. However, the embodiments are not limited in this context. In particular, a plasma flood gun, such as plasma flood gun 100 may be employed in any apparatus that generates a wide ion beam having a width greater than about 200 mm. The operation of various components of the ion implantation system 150, including ion source 152, analyzing magnet 154, and substrate stage 160 are well known and further discussion of such components is omitted herein.

As illustrated in FIG. 1B the ion beam 162 is directed along a path in which the direction of propagation changes between ion source 152 and substrate stage 160. In addition, when incident upon the substrate 164, the ion beam 162 has a beam width $W_B$ slightly larger than the width $W_S$ of the substrate 164, for example, 110% to 120% of the value of $W_S$. The width W of the plasma flood gun 100 (see FIG. 1A) is also comparable to $W_B$ and $W_S$ such that the substrate 164 may be simultaneously exposed to ions from the ion beam 162 and electrons from the plasma flood gun 100 over entire width $W_S$.

Figure 2:
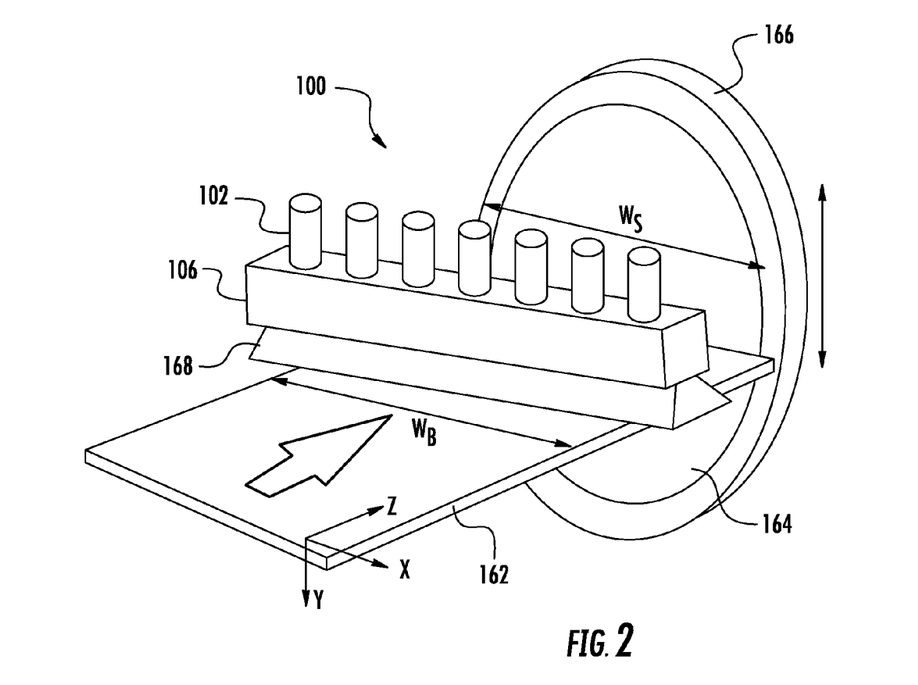
FIG. 2 depicts a perspective view of processing of a substrate using a plasma flood gun in an ion implantation system.

FIG. 2 provides more details of the geometry of substrate processing by simultaneous exposure to a wide ion beam and electron source in accordance with the present embodiments. In particular, there is shown a perspective view of processing of a substrate 164 using a plasma flood gun 100 in an ion implantation system with components removed for clarity. As shown in FIG. 2, the substrate 164 is mounted to a platen 166 that is operative to move along the Y-direction. The substrate 164 is exposed to the ribbon ion beam 162 whose beam width $W_B$ is slightly larger than width $W_S$ of the substrate 164. By scanning the substrate 164 a sufficient distance along the Y direction, the entire substrate 164 may therefore be exposed to the ion beam 162. As further illustrated in FIG. 2, the plasma flood gun 100 is positioned to provide electrons 168 that exit the diffusion chamber 106 adjacent the ion beam 162. The electrons 168 may form a uniform cloud that extends across the width $W_B$ of the ion beam so that the substrate 164 is exposed to a uniform flux of ions and electrons across the substrate width $W_S$.

Figure 3A:
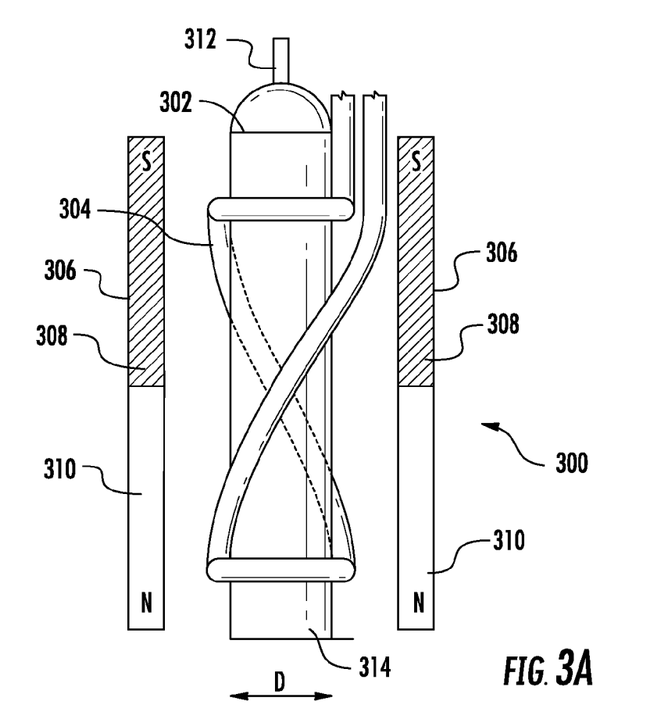
FIG. 3A depicts a side view of an exemplary helicon plasma source.

As discussed previously, the plasma flood guns of the present embodiments contain an array of compact helicon plasma sources configured to generate a high flux of electrons across a large width. FIG. 3A depicts a side view of an exemplary helicon plasma source 300. The helicon plasma source 300 includes a plasma chamber 302. The plasma chamber 302 may have a cylindrical shape and may have diameter of four to thirty centimeters in some embodiments. In one particular configuration, the plasma chamber 302 may be made from a quartz cylinder having a diameter between 5-7 cm and height of 10-15 cm. This provides a compact source of electrons which may exit the plasma chamber 302 from one side 314. As shown in FIG. 3A, a helical antenna 304, which may be a water cooled conductor such as copper, is disposed around the plasma chamber 302. The helical antenna 304 is used to generate a plasma in the plasma chamber 302 when an RF current is passed through the helical antenna 304.

The helicon plasma source 300 also includes a magnet 306 that is disposed around the plasma chamber 302 and generates an axial magnetic field within the plasma chamber 302. In various embodiments, the magnet 306 may be a permanent magnet or may be a solenoid. In the example depicted in FIG. 3, the magnet 306 is a permanent magnet that includes first portion 308 and second portion 310 that represent regions of opposite magnetic polarity so that the magnetic field lines exit the north pole face and enter south pole face. The helicon plasma source 300 includes a gas inlet 312 in communication with the plasma chamber 302 to admit gas species into the plasma chamber 302. In various embodiments, gas species such as argon or other inert gas is used to generate a plasma within the helicon plasma source 300. However other gas species may be used to generate the plasma discharge. The embodiments are not limited in this context. When gas is admitted into the plasma chamber 302 and RF power is applied to the helical antenna 304, a helicon plasma discharge may be ignited. This discharge produces a high density plasma that may generate a high flux of electrons that can exit the plasma chamber 302 through an aperture 314 on the bottom of discharge tube. Although the embodiment of FIG. 3A shows a gas inlet 312 directly coupled to the plasma chamber 302, in other embodiments, a gas inlet may be coupled to a common diffusion chamber that communicates with multiple plasma chambers 302.

Figure 3B:
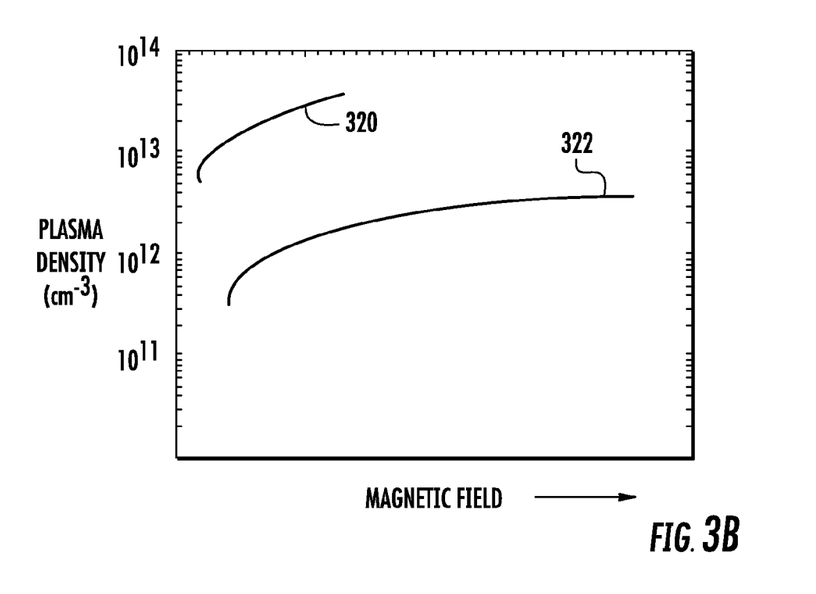
FIG. 3B compares plasma density produced by different types of sources.

One advantage provided by the helicon plasma source 300 is that a high density of electrons may be generated without generating metallic species as is the case for conventional filament based plasma flood guns. In the present disclosure, helicon plasma chamber is made of a dielectric material, helicon antenna is outside the chamber therefore there are not metallic parts exposed to the plasma. By way of background, helicon discharges are known for their ability to produce a high ionization efficiency, often above 90%. FIG. 3B compares the estimated plasma density that may be produced by a helicon plasma source of the present embodiments in comparison to conventional microwave sources. In particular, the curves 320, 322 show the qualitative behavior of plasma density as a function of magnetic field for helicon and microwave sources, respectively. The range of magnetic field spanned along the abscissa may be up to several kiloGauss. As can be seen, the plasma density in the helicon discharge is more than an order of magnitude higher than that produced by microwave sources. The plasma densities achievable by helicon plasma sources are higher than $5 \times 10^{12}$ cm$^{-3}$. Another feature apparent is that a high plasma density may be achieved using moderate magnetic fields. In some known helicon discharges the plasma densities of greater than $5 \times 10^{12}$ cm$^{-3}$ are achieved at magnetic field strengths of less than 1000 Gauss, such as about 200 Gauss.

As explained below, the present embodiments take further advantage of the use of helicon plasmas to generate electrons by arranging the helicon plasma sources to favor generation of a particular helicon mode throughout the electron flood gun. This mode is especially effective in generating high density plasmas in compact helicon plasma source geometries. In helicon plasmas power transfer from an RF generator to the plasma takes place via helicon waves, which are a type of whistler wave bounded to a magnetized cylindrical plasma. Helicon wave quantities vary according to B (r,θ,z, t)=f(r) exp [i(mθ+kz−ωt)], where R, θ and z are spatial coordinates, t is time, f(r) the radial density profile, k the wave vector, ω the wave pulsation, and m the azimuthal mode. Depending upon various factors of a helicon plasma source, different azimuthal modes may be excited in a helicon plasma source. Some of these azimuthal modes (or simply "modes") may not be ideally suited to generating a uniform plasma, and helicon plasma sources have not met widespread use for processing substrates heretofore.

In particular, when m=±1 the patterns remain unchanged in time and space, and simply rotate in the +θ direction in time at a fixed position z, and in the −θ direction as z increases at a given time. The symmetric m=0 mode, on the other hand, changes its field pattern so that the wave electric filed changes from purely electromagnetic to purely electrostatic in every half wavelength. As a result, the ionization rate changes in time and space within a plasma excited in the m=0 mode, resulting in a varying plasma density. Accordingly, either m=+1 or m=−1 modes may be used to generate discharges to produce constant electron density.

However, consistent with various embodiments, it has been determined that use of m=+1 mode generates better plasma properties in the case of a compact helicon plasma source. The dispersion curve behavior for m=+1 and m=−1 modes for helicon plasma sources has previously been studied as a function of radial density profile. It has been previously observed that the m=+1 mode exhibits little dependence upon the profile width (wp) whereas the m=−1 mode exhibits strong dependence on wp and exhibits a cutoff behavior where the real (Re) and imaginary (Im) parts of the axial refractive index approach the value of ~20. This may take place, for example, when wp decreases below 5 cm. Accordingly, if the plasma is too narrow, the m=−1 mode may not propagate or may be strongly damped or even evanescent. In the present embodiments, arrays of helicon plasma sources are configured so that the helicon plasma sources operate to generate the m=+1 mode. This allows the compact helicon plasma source chambers to be constructed over convenient range of diameters, such as between 4 cm to 10 cm diameter without affecting the ability of the m=+1 mode to propagate, thereby ensuring high plasma density even for chambers operating at 4 cm diameter.

In various embodiments, the RF power applied to helicon plasma sources is in the range of 500 to 2000 W. In this range of RF power it has also been found that the use of the m=+1 mode generates twice the plasma density or greater as compared to the plasma density generated by the m=−1 mode.

Figure 4A:
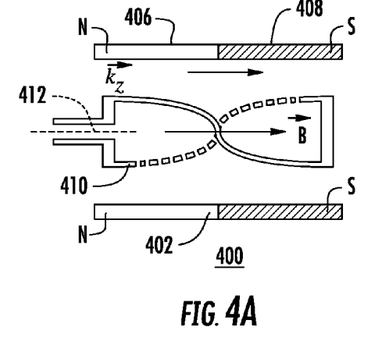
FIGS. 4A to 4D present a cross-sectional view of alternative configurations of helical-coil-and-magnet combinations.

Returning to FIG. 3A, in various embodiments a helicon plasma is generated in a helicon plasma source by a helical antenna 304 that is used to excite the plasma. Regarding the configuration of the helical antenna 304, the direction of the wave vector $k_z$ is determined by the helicity of the helical antenna 304, that is whether its spiral exhibits right handedness or left handedness. The m=+1 mode is excited when the direction of wave vector $k_z$ is aligned with the direction of the magnetic field (B) generated by the magnet 306. FIGS. 4A to 4D present a cross-sectional view of alternative configurations of helical-coil-and-magnet combinations that are used to illustrate how the m=+1 mode may be generated. In particular, FIGS. 4A-4D present four different configurations each of which may be used to produce either an m=+1 mode or m=−1 mode in a helicon plasma. In FIG. 4A, the configuration 400 includes a magnet 402 that is disposed concentrically about a helical coil 410. The magnet 402 and helical coil 410 may define an axis 412 that extends along the Z-direction in the Cartesian coordinate shown. For purposes of illustration the helical coil 410 may be deemed to have a first helicity. In the illustration shown, the helical coil 410 generates a wavevector $k_Z$ that is directed to the right along the Z-axis. The magnet 402, which includes portions 406 and 408 that generate the N-S configuration as shown, such that the magnetic field strength vector B inside the magnet is oriented along the axis 412 in the same direction as the wavevector $k_Z$. In this configuration, a m=+1 mode is generated.

Figure 4B:
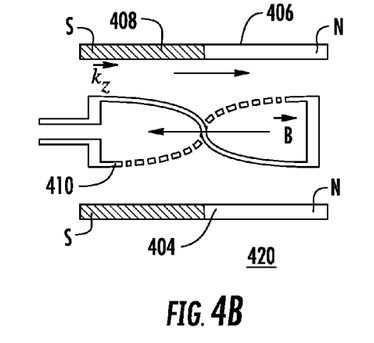

In FIG. 4B, the configuration 420 includes the helical coil 410 that generates a wavevector $k_Z$ that is directed to the right along the Z-axis. The magnet 404 includes the portions 406 and 408 that generate the N-S configuration as shown, such that the magnetic field strength vector B is directed to the left along the axis 41 in the opposite direction as the wavevector $k_Z$. In this configuration, a m=−1 mode is generated.

Figure 4C:
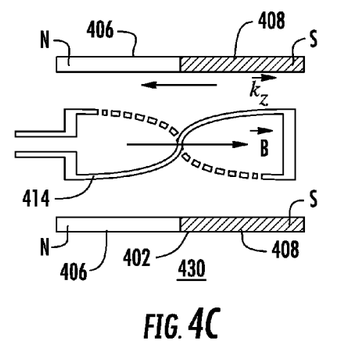

In FIG. 4C, the configuration 430 includes a the helical coil 414, which has opposite helicity as that of helical coil 410, generates a wavevector $k_Z$ that is directed to the left along the Z-axis. The magnet 402 includes the portions 406 and 408 that generate the N-S configuration as shown, such that the magnetic field B is directed to the right along the axis 412 in the opposite direction as the wavevector $k_Z$. In this configuration, a m=−1 mode is generated.

Figure 4D:
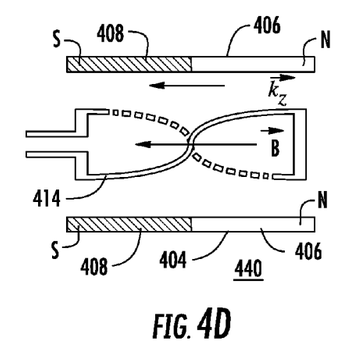

In FIG. 4D, the configuration 440 includes the helical coil 414 that generates a wavevector $k_Z$ that is directed to the left along the Z-axis. The magnet 404 includes the portions 406 and 408 that generate the N-S configuration as shown, such that the magnetic field strength B is directed to the left along the axis 412 in the same direction as the wavevector $k_Z$. In this configuration, a m=+1 mode is generated similarly to the configuration 400 of FIG. 4A, in which the magnetic field strength vector B and wavevector $k_Z$ are both oriented in the same direction opposite to that of their counterparts in the configuration 440.

Referring again also to FIG. 3A, in various embodiments the helicon plasma source is constructed by arranging the antenna and the magnet using either the configuration 400 or configuration 440. In this manner a helicon plasma is generated using the m=+1 mode that creates a high electron density in the plasma chamber 302. Referring also to FIG. 2, a difference between configurations 400 and 440, aside from the differing helicity of helical turns, is that in one configuration the magnetic field strength vector B points towards a diffusion chamber (see 106) into which the electrons diffuse, and in the other configuration the magnetic field points away from the diffusion chamber.

Figure 5A:
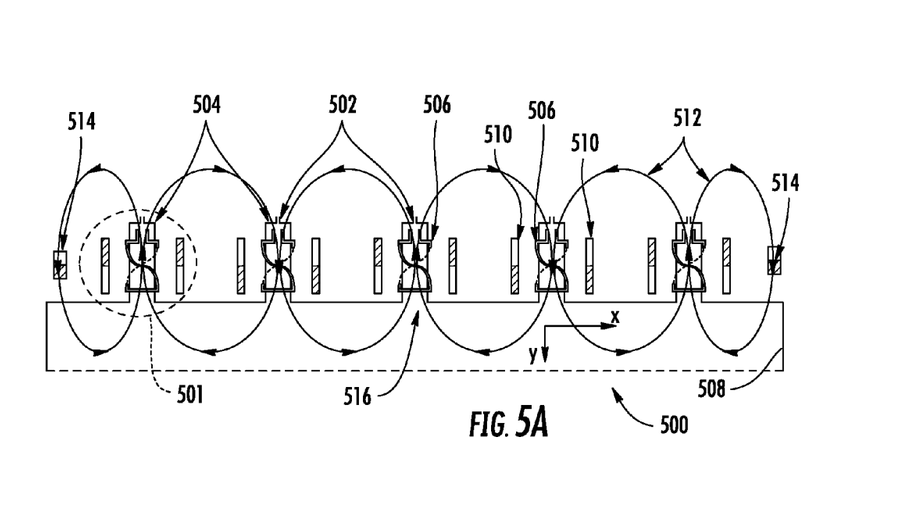
FIGS. 5A and 5B depict respective side cross-sectional and top cross-sectional views of an embodiment of a plasma flood gun.
Figure 5B:
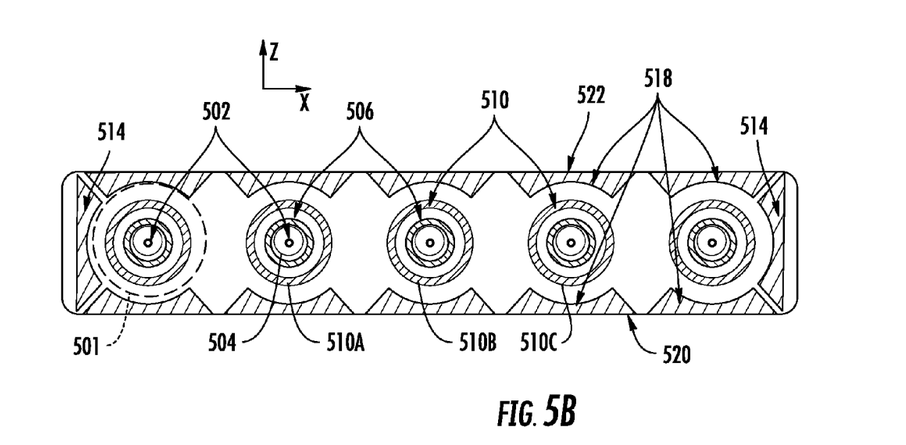

FIGS. 5A and 5B depict an embodiment of a plasma flood gun 500 that takes advantage of the ability to generate helicon plasmas excited by the m=+1 mode using magnetic fields that are alternatively oriented in opposite directions. In FIG. 5A there is shown a side cross-sectional view of the plasma flood gun 500 which is constructed using a linear array of nine helicon plasma sources 501. In FIG. 5B there is shown a top cross-sectional view of the plasma flood gun 500. For clarity components of the plasma flood gun, including chamber walls of the helicon plasma sources 501, are omitted. The number of helicon plasma sources 501 may be changed in other embodiments. As illustrated, gas inlets 502 are coupled to a plasma chamber 504 that is defined within helical coils 506. A diffusion chamber 508 is disposed adjacent the helicon plasma sources 501. Disposed around each helical coil 506 is a cylindrical magnet 510.

As further shown in FIGS. 5A and 5B, the magnetic field orientation alternates between each helicon plasma source 501 such that the magnetic field direction of any helicon plasma source 501 is opposite that of its neighbor, that is, an adjacent helicon plasma source 501. Thus, for example, the cylindrical magnets 510A, 510B, which are adjacent one another (nearest neighbors) have magnetic fields directed in mutually opposite directions along the Z-axis as shown. On the other hand, the cylindrical magnets 510A, 510C, which are next nearest neighbors, have magnetic fields directed along the same direction directions along the Z-axis as shown. An advantage of this configuration is that the magnetic field lines 512 generated throughout the plasma flood gun 500 close at the exit portions 516 of each helicon plasma source 501. This allows electrons to flow in an unimpeded fashion from each helicon plasma source 501 into the diffusion chamber 508. In addition, within each helicon plasma source 501, the magnetic field lines will positively compose, resulting in a higher magnetic field strength. It is to be noted that the helicity of helical antennas also alternates between left handed and right handed between successive helicon plasma sources 501. This is done in order to maintain excitation of the m=+1 azimuthal mode which requires that the wave vector $k_Z$ and magnetic field B be aligned along a common direction as discussed above with respect to FIGS. 4A-4C.

Assuming the same magnetic field strength is applied to each helicon plasma source 601, given the fact that the m=+1 mode is excited in each, the same plasma density may also be excited in each helicon plasma source 501. This results in generation of the same electron flux into the diffusion chamber 508 along the width of the plasma flood gun 500.

To completely close the field lines in quadrants having x-z as the plane of symmetry, at each end of the plasma flood gun 500 permanent magnets 514 are disposed to close the field lines from the outermost helicon plasma sources 501. As further shown in FIG. 5B, side magnets 518 whose polarity alternates between successive helicon plasma sources, are also provided along edges of the plasma flood gun 500 along the X direction. In particular, the side magnets are disposed along opposite sides 520, 522 of the electron flood gun. As illustrated, side magnet portions are disposed adjacent each helicon plasma source 501 such that the polarity of the side magnet portions one each size of a helicon plasma source 501 is the same, and the polarity of the side magnet portions alternates between successive helicon plasma sources 501.

As noted previously embodiments in which a plasma flood gun contains multiple helicon plasma sources that are arranged in two dimensional arrays are also possible. In such plasma flood guns the two dimensional arrays of helicon plasma sources may be arranged in a "checkerboard" pattern. The checkerboard pattern is made up of an helicon plasma sources in which, for a given helicon plasma source, its magnetic field and wave vector are directed in an opposite to direction to the respective magnetic field and respective wave vector of any adjacent helicon plasma source along an X-direction and opposite to the direction to the magnetic field and wavevector of any adjacent helicon plasma source along a Y-direction.

In summary, the configurations of a plasma flood gun disclosed herein provide a scalable design that produces a uniform plasma density in time and space along an entire width of a diffusion chamber used to supply electrons. By employing an array of compact helicon plasma sources configured to excite an m=+1 mode, a high electron density is generated. This is enhanced by the alternating configuration of adjacent helicon plasma sources in which the direction of magnetic field changes from a first direction to an opposite direction in successive helicon plasma sources, which allows electrons to flow unimpeded into the common diffusion chamber.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Thus, the claims set forth below should be construed in view of the full breadth and spirit of the present disclosure as described herein.

What is claimed is:

1. An apparatus to provide electrons to a substrate, comprising:
   a plurality of helicon plasma sources arranged in a helicon source array;
   each helicon plasma source comprising:
      a helical antenna configured to generate a wave vector parallel to a first axis; and
      a magnet configured to generate a magnetic field vector parallel to the first axis,
      wherein each helicon plasma source is further configured to generate a respective magnetic field vector that is opposite that of a magnetic field vector of an adjacent helicon plasma source; and
   a diffusion chamber disposed adjacent to the helicon source array and coupled to the plasma chamber of each helicon plasma source via a respective aperture in the each helicon plasma source,
   wherein a magnetic field of the each helicon plasma source extends into the diffusion chamber and into the adjacent helicon plasma source.

2. The apparatus of claim 1, wherein the helicon source array comprises a one dimensional array.

3. The apparatus of claim 1, wherein the plurality of helicon plasma sources are spaced by a distance of five centimeters to thirty centimeters.

4. The apparatus of claim 1, wherein the magnet comprises a permanent magnet having a cylindrical shape or a solenoid, and wherein the magnet encompasses the helical antenna.

5. The apparatus of claim 1, wherein each helicon plasma source further comprises:
   a plasma chamber;
   a gas inlet configured to admit a source gas into the plasma chamber to generate the plasma; and
   an aperture to extract electrons from the plasma chamber.

6. The apparatus of claim 5, wherein the plasma chamber comprises a cylindrical shape.

7. The apparatus of claim 6, wherein the plasma chamber is disposed within a space defined by the helical antenna.

8. The apparatus of claim 6, wherein the source gas comprises an inert gas.

9. The apparatus of claim 1, wherein the helical coil and magnet of the plurality of helicon plasma sources are arranged to produce an m=+1 azimuthal mode within a helicon plasma source, wherein a helicon wave varies according to $B(r,\theta,z,t)=f(r)\exp[i(m\theta+kz-\omega t)]$, where B is magnetic field, R, $\theta$ and z are spatial coordinates, t is time, f(r) is radial density profile, k is wave vector, $\omega$ is wave pulsation, and m the azimuthal mode.

10. The apparatus of claim 1, wherein the plurality of helicon sources are configured to generate a plasma density of $5\times10^{12}$ cm$^{-3}$ or greater.

11. An ion implantation system, comprising:
    beam components to direct an ion beam to a substrate; and
    a plasma flood gun disposed proximate the substrate, the plasma flood gun comprising:
       a plurality of helicon plasma sources arranged in a helicon source array, each helicon plasma source comprising:
          a helical antenna configured to generate a wave vector parallel to a first axis; and
          a magnet configured to generate a magnetic field vector parallel to the first axis,
          wherein each helicon plasma source is further configured to generate a respective magnetic field vector that is opposite that of a magnetic field vector of an adjacent helicon plasma source; and
       a diffusion chamber disposed adjacent to the helicon source array and coupled to the plasma chamber of each helicon plasma source via a respective aperture in the each helicon plasma source,
       wherein a magnetic field of the each helicon plasma source extends into the diffusion chamber and into the adjacent helicon plasma source.

12. The ion implantation system of claim 11, wherein each helicon plasma source further comprises:
    a cylindrical plasma chamber disposed within a space defined by the helical antenna;
    a gas inlet configured to admit a source gas into the plasma chamber to generate the plasma; and
    an aperture to extract electrons from the plasma chamber.

13. The ion implantation system of claim 12, wherein the diffusion chamber is configured to supply electrons to the ion beam that neutralize positive charge from the ion beam at the substrate.

14. The ion implantation system of claim 11, wherein the plurality of helicon plasma sources are spaced by a distance of five centimeters to thirty centimeters.

15. The ion implantation system of claim 11, wherein the magnet comprises a cylinder that encompasses the helical antenna.

16. The ion implantation system of claim 15, wherein the source gas comprises an inert gas.

17. The ion implantation system of claim 11, further comprising:
    an array of side magnets disposed along opposite sides of each helicon plasma source; and
    a pair of end magnets disposed at opposite ends of the array of helicon plasma sources.

* * * * *